(12) United States Patent
Liu (10) Patent No.: US 12,131,963 B2
(45) Date of Patent: Oct. 29, 2024

(54) POSITION DETECTION AND DETERMINATION DEVICE AND POSITION CALIBRATION DEVICE AND METHOD

(71) Applicant: CHANGXIN MEMORY TECHNOLOGIES, INC., Hefei (CN)

(72) Inventor: Chin-Kun Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 498 days.

(21) Appl. No.: 17/598,801

(22) PCT Filed: Jun. 22, 2021

(86) PCT No.: PCT/CN2021/101377
§ 371 (c)(1),
(2) Date: Sep. 27, 2021

(87) PCT Pub. No.: WO2021/259220
PCT Pub. Date: Dec. 30, 2021

(65) Prior Publication Data
US 2022/0415722 A1    Dec. 29, 2022

(30) Foreign Application Priority Data

Jun. 23, 2020  (CN) .......................... 202010581245.3

(51) Int. Cl.
*H01L 21/67* (2006.01)
*H01L 21/66* (2006.01)
*H01L 21/677* (2006.01)

(52) U.S. Cl.
CPC ........ *H01L 22/26* (2013.01); *H01L 21/67259* (2013.01); *H01L 21/67742* (2013.01); *H01L 22/12* (2013.01)

(58) Field of Classification Search
CPC .............. H01L 22/26; H01L 21/67259; H01L 21/67742; H01L 22/12; H01L 21/67775;
(Continued)

(56) References Cited

U.S. PATENT DOCUMENTS 6,212,751 B1 * 4/2001 Hattori ................ G05B 19/402
324/763.01
6,297,075 B1 * 10/2001 Odajima ............. H01L 21/6836
438/464
(Continued)

FOREIGN PATENT DOCUMENTS

CN         102338605 A      2/2012
CN         202601589 U     12/2012
(Continued)

OTHER PUBLICATIONS

Second Office Action of the corresponding Chinese application No. 202010581245.3, issued on Jul. 15, 2022, 36 pages.
(Continued)

*Primary Examiner* — Ali Bayat
(74) *Attorney, Agent, or Firm* — Syncoda LLC; Feng Ma (57) ABSTRACT

A position detection and determination device and a position calibration device and method are provided. The position detection and determination device includes a standard positioning pin position limiting component configured to limit standard position information of a positioning pin of a load port of a silicon wafer pod; a positioning pin position detecting component configured to detect real-time position information of the positioning pin of the load port of the silicon wafer pod; and a determining module configured to obtain the standard position information and the real-time position information, and determine whether the position of the positioning pin of the load port of the silicon wafer pod
(Continued)

is accurate or not according to the standard position information and the real-time position information.

8 Claims, 7 Drawing Sheets

(58) Field of Classification Search
CPC ...... G01B 5/00; G01B 21/042; G01N 21/956; G01N 21/95607
USPC ........................................................ 382/147
See application file for complete search history.

(56) References Cited

U.S. PATENT DOCUMENTS

| | | | | |
|---|---|---|---|---|
| 8,854,449 | B2 * | 10/2014 | Aikawa | H01L 21/68721 348/87 |
| 2001/0029064 | A1 * | 10/2001 | Odajima | H01L 21/67132 438/464 |
| 2012/0118083 | A1 * | 5/2012 | Mori | H01L 21/67265 73/864.91 |
| 2019/0240794 | A1 | 8/2019 | Nishida | |

FOREIGN PATENT DOCUMENTS

| | | |
|---|---|---|
| CN | 104743160 A | 7/2015 |
| CN | 204461295 U | 7/2015 |
| CN | 109979845 A | 7/2019 |
| CN | 209310669 U | 8/2019 |
| CN | 210570322 U | 5/2020 |
| CN | 210664329 U | 6/2020 |
| CN | 210668197 U | 6/2020 |
| CN | 210668297 U | 6/2020 |
| JP | S59163501 A | 9/1984 |
| JP | S59163501 U | 11/1984 |
| JP | H04123495 A | 4/1992 |
| JP | 2000269302 A | 9/2000 |
| JP | 2001189371 A | 7/2001 |
| JP | 2003124291 A | 4/2003 |
| JP | 2008108765 A | 5/2008 |
| JP | 2018017519 A | 2/2018 |

OTHER PUBLICATIONS

Written Opinion cited in PCT/CN2021/101377, mailed on Sep. 27, 2021, 7 pages.
International Search Report as cited in PCT/CN2021/101377 mailed Sep. 27, 2021, 10 pages.

\* cited by examiner

POSITION DETECTION AND DETERMINATION DEVICE AND POSITION CALIBRATION DEVICE AND METHOD

CROSS-REFERENCE TO RELATED APPLICATIONS

The present disclosure claims priority to Chinese Patent Application No. 202010581245.3, entitled "POSITION DETECTION AND DETERMINATION DEVICE AND POSITION CALIBRATION DEVICE AND METHOD" and filed on Jun. 23, 2020, the entire contents of which are incorporated herein by reference.

TECHNICAL FIELD

The present disclosure relates to a semiconductor device, and in particular to a position detection and determination device and a position calibration device and method.

BACKGROUND

With the increasing development of semiconductor technologies and the increase in market demand for semiconductor products, the degree of automation of semiconductor production lines is getting higher and higher, which puts forward higher requirements for the stability and coordination of various components in the automated semiconductor production lines.

Especially in automated semiconductor manufacturing production lines, equipment failures or shutdowns not only directly reduce production efficiency, but also cause higher economic losses. For example, if an FOUP (Front Opening Unified Pod) is improperly placed, when the entrance tray is raised to carry and deliver the FOUP, machine equipment may interfere at a port, causing the machine to malfunction or cause a damage to the FOUP.

However, the adjustment and positioning of a load port of a traditional FOUP are both carried out with FOUP as an adjustment object or by virtue of position adjustment tools provided by FOUP load port manufacturers. There is no available tools to determine the adjustment accuracy of the load port of the FOUP, or no a unified tool for the adjustment and detection of various FOUP load ports, thereby resulting in frequent door opening and closing abnormalities or interference damage in the automated semiconductor manufacturing production line, increasing the downtime of the equipment, reducing the production efficiency of the automated semiconductor manufacturing production line, and causing unnecessary economic losses.

SUMMARY

According to a first aspect of the present disclosure, provided is a position detection and determination device, including:
  a standard positioning pin position limiting component configured to limit standard position information of a positioning pin of a load port of a silicon wafer pod;
  a positioning pin position detecting component configured to detect real-time position information of the positioning pin of the load port of the silicon wafer pod; and
  a determining module configured to obtain the standard position information and the real-time position information, and determine whether the position of the positioning pin of the load port of the silicon wafer pod is accurate or not according to the standard position information and the real-time position information.

According to a second aspect of the present disclosure, provided is a position calibration device, including:
  the position detection and determination device as described above; and
  a calibrating component configured to move and change the position of the positioning pin of the load port of the silicon wafer pod according to the obtained standard position information and real-time position information so that a difference between the standard position information and the real-time position information is less than or equal to a preset accuracy threshold.

According to a third aspect of the present disclosure, provided is a position determination and calibration method, including the following steps:
  providing a standard positioning pin position limiting component to limit standard position information of a positioning pin of a load port of a silicon wafer pod;
  detecting real-time position information of the positioning pin of the load port of the silicon wafer pod by using a positioning pin position detecting component; and
  determining whether the position of the positioning pin of the load port of the silicon wafer pod is accurate or not according to the standard position information and the real-time position information; and if not, controlling a calibrating component to move and change the position of the positioning pin of the load port of the silicon wafer pod so that a difference between the standard position information and the real-time position information is less than or equal to a preset accuracy threshold.

The details of one or more embodiments of the present disclosure are set forth in the following drawings and description. Other features, objectives and advantages of the present disclosure will become apparent from the description, drawings and claims.

BRIEF DESCRIPTION OF DRAWINGS

In order to more clearly describe the technical solutions of the embodiments of the present disclosure, the following will briefly introduce the drawings needed in the embodiments. The additional details or examples used to describe the drawings should not be considered as a limitation on the scope of any one of the present disclosure, the currently described embodiments, or the preferred manners of the present disclosure.

FIG. 5b is a schematic diagram of an operation interface of a display screen shown in FIG. 5a.

DESCRIPTION OF EMBODIMENTS

For easy understanding of the present disclosure, a more comprehensive description of the present disclosure will be given below with reference to the relevant accompanying drawings. Preferred embodiments of the present disclosure are given in the accompanying drawings. However, the present disclosure may be implemented in many different forms and is not limited to the embodiments described herein. On the contrary, these embodiments are provided to make the contents disclosed by the present disclosure understood more thoroughly and comprehensively.

Unless defined otherwise, all technical and scientific terms used herein have the same meanings as are commonly understood by those skilled in the art. The terms used herein in the specification of the present disclosure are for the purpose of describing specific embodiments only but not intended to limit the present disclosure.

In the case of using "include" and "have" and "comprise" described herein, unless a clearly defined term is used, such as "only" and "consisting of", another component may be added. Unless mentioned to the contrary, terms in the singular form may include the plural form, and it cannot be understood that the number is one.

In the present disclosure, unless otherwise stated and defined explicitly, the terms such as "install" "link", "connect", and "fix" should be understood in a broad sense; for example, a connection may be a fixed connection, a detachable connection, or an integrated connection; may be a mechanical connection or an electrical connection; and may be a direct connection, an indirect connection through an intermediate medium, or a communication inside two components or interaction between two components. For those skilled in the art, the specific meanings of the above terms in the present disclosure could be understood according to the specific conditions.

Moreover, the terms such as "first" and "second" are used for descriptive purposes only and are not to be construed as indicating or implying a relative importance or implicitly indicating the number of technical features indicated.

In the embodiments of the present disclosure, the term "distal end" refers to an end far away from the user, and the term "near end" refers to an end close to the user.

Figure 1:
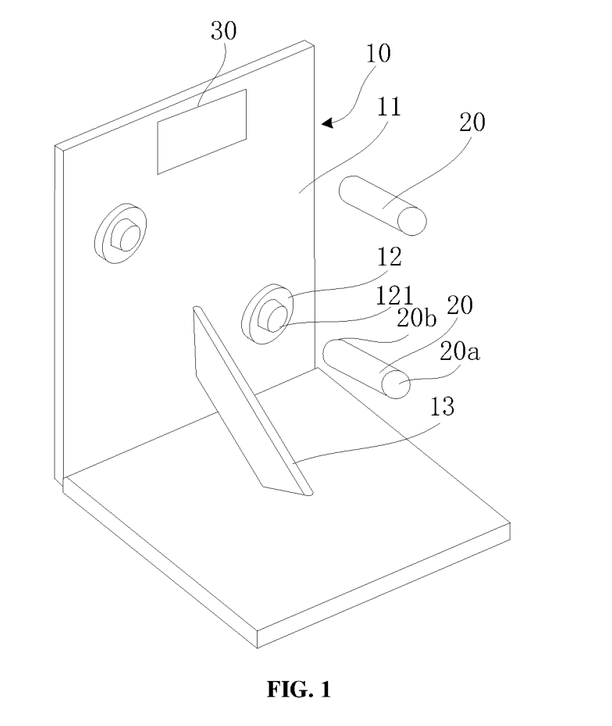
FIG. 1 is a schematic three-dimensional structural diagram of a position detection and determination device according to an embodiment of the present disclosure.
Figure 2:
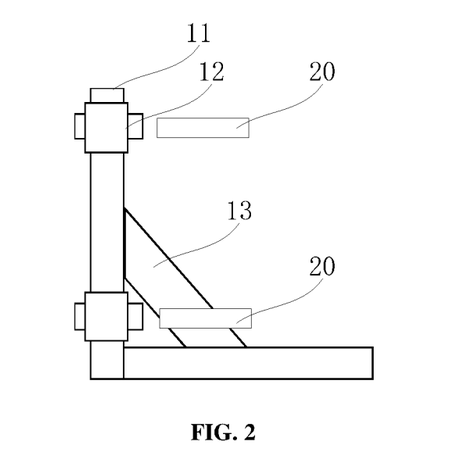
FIG. 2 is a schematic left view of the position detection and determination device shown in FIG. 1.

In an embodiment of the present disclosure and referring to FIG. 1 to FIG. 2, a position detection and determination device according to includes a standard positioning pin position limiting component 10, a positioning pin position detecting component 20, and a determining module 30. The standard positioning pin position limiting component 10 is configured to limit standard position information of a positioning pin of a load port of a silicon wafer pod; the positioning pin position detecting component 20 is configured to detect real-time position information of the positioning pin of the load port of the silicon wafer pod; and the determining module 30 is configured to obtain the standard position information and the real-time position information, and determine whether the position of the positioning pin of the load port of the silicon wafer pod is accurate or not according to the standard position information and the real-time position information.

Specifically, in the position detection and determination device in the above embodiment, the standard positioning pin position limiting component 10 is configured to limit the standard position information of the positioning pin of the load port of the silicon wafer pod, the positioning pin position detecting component 20 is configured to detect the real-time position information of the positioning pin of the load port of the silicon wafer pod, and the standard position information of the positioning pin of the load port of the silicon wafer pod, limited by the standard positioning pin position limiting component 10, is used as a reference standard information for the real-time position information of the positioning pin, so that the determining module 30 can determine whether the position of the positioning pin of the load port of the silicon wafer pod is accurate or not according to the standard position information and the real-time position information, thereby facilitating a position adjustment for the positioning pin of the load port of the silicon wafer pod, and avoiding equipment interference or abnormal operation caused by an inaccurate position of the positioning pin of the load port of the silicon wafer pod.

Further, referring to FIG. 1 to FIG. 2 again, in an embodiment of the present disclosure, the standard positioning pin position limiting component 10 includes a bearing carrier 11 and positioning pin matching structures 12, and the positioning pin matching structures 12 are arranged on the bearing carrier 11. For example, the positioning pin matching structure 12 may be arranged on a surface of the bearing carrier 11 to limit the standard position of each positioning pin. In this embodiment, a handle 13 can further be arranged on the surface of the bearing carrier 11 to facilitate the carrying or movement of the bearing carrier 11 and drive the standard positioning pin position limiting component 10 to move to accurately limit the standard position of each positioning pin.

Specifically, in the position detection and determination device in the above embodiment, the positioning pin matching structure 12 is configured to limit the standard position of each of the positioning pins so that the calibrating component can obtain position information of a calibration target, thus facilitating the position calibration for the positioning pin of the load port of the silicon wafer pod by the calibrating component. Since the number and position distribution of the positioning pin matching structures on the bearing carrier 11 can be set in one-to-one correspondence with the number and position distribution of the positioning pins of the load port of the silicon wafer pod, the positioning pin matching structures 12 on the bearing carrier 11 can respectively contact and cover the positioning pins of the load port of the silicon wafer pod through the bearing carrier 11, and at the same time the standard position of each positioning pin of the load port of the silicon wafer pod can be limited; in this way, the calibration operation is facilitated and the accuracy of the position distribution of the positioning pins after calibration is also improved, thus effectively improving the positioning accuracy of the silicon wafer pod.

Figure 3:
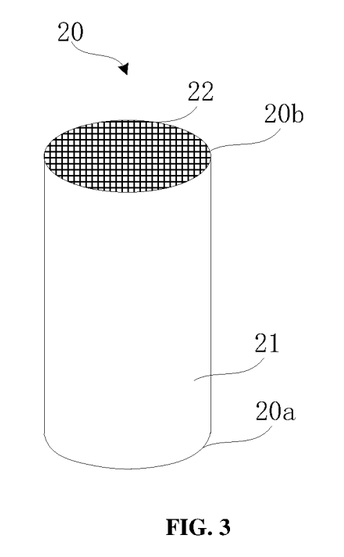
FIG. 3 is a schematic structural diagram of a positioning pin position detecting component according to an embodiment of the present disclosure.

Further, referring to FIG. 1 to FIG. 3, in an embodiment of the present disclosure, the positioning pin position detecting component 20 includes a movable body 21 and a piezoelectric sensor 22. The movable body 21 is cylindrical and includes a proximal end 20a and a distal end 20b. The piezoelectric sensor 22 is arranged at the distal end 20b of the movable body for detecting the real-time position information of the positioning pin. The movable body 21 is configured to move in a preset direction to drive the piezoelectric sensor 22 to come into contact with the positioning pin (not shown) of the load port of the silicon wafer pod, so that the piezoelectric sensor detects the real-time position information of the positioning pin.

Specifically, in the position detection and determination device in the above embodiment, the movable body 21 moves in the preset direction to drive the piezoelectric sensor 22 to come into contact with the positioning pin, so that the positioning pin can be conveniently moved in a direction close to the standard position according to the real-time position information of the positioning pin detected by the piezoelectric sensor, thereby realizing the accurate position calibration for the positioning pin and effectively improving the efficiency of the calibration.

Figure 4:
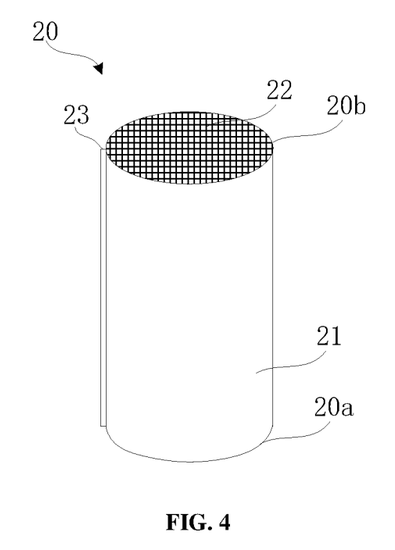
FIG. 4 is a schematic structural diagram of a positioning pin position detecting component according to an embodiment of the present disclosure.

Further, in an embodiment of the present disclosure, referring to FIG. 4, the positioning pin position detecting component 20 further includes a positioning guide rail 23 configured to limit a moving position and a moving direction of the movable body 21; the movable body 21 is configured to move along the positioning guide rail 23 to drive the piezoelectric sensor 22 to contact and cover an upper surface of the positioning pin, so that the piezoelectric sensor 22 detects image information of the upper surface of the positioning pin.

Specifically, in the position detection and determination device in the above embodiment, since a relative position of the positioning guide rail 23 is determined, the standard position information of the positioning pin, limited by the standard positioning pin position limiting component, is relatively determined; as a result, the positioning pin can be conveniently moved in a direction close to the standard position, thereby realizing the accurate position calibration for the positioning pin and effectively improving the efficiency of the calibration.

Figure 5A:
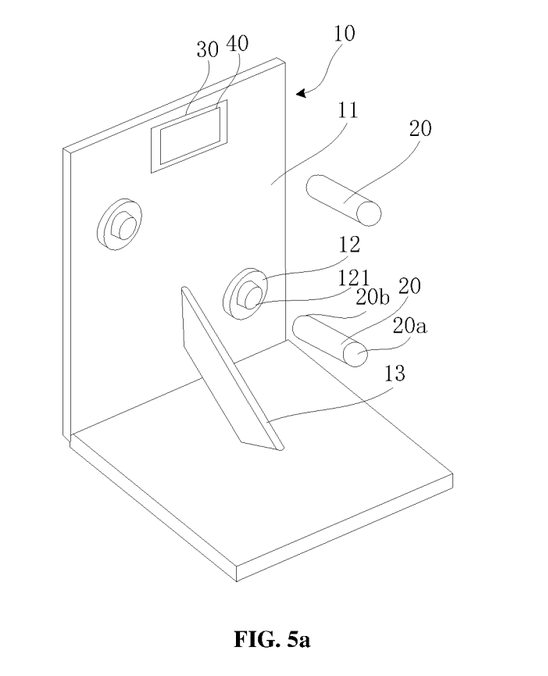
FIG. 5a is a schematic three-dimensional structural diagram of a position detection and determination device according to an embodiment of the present disclosure.
Figure 5B:
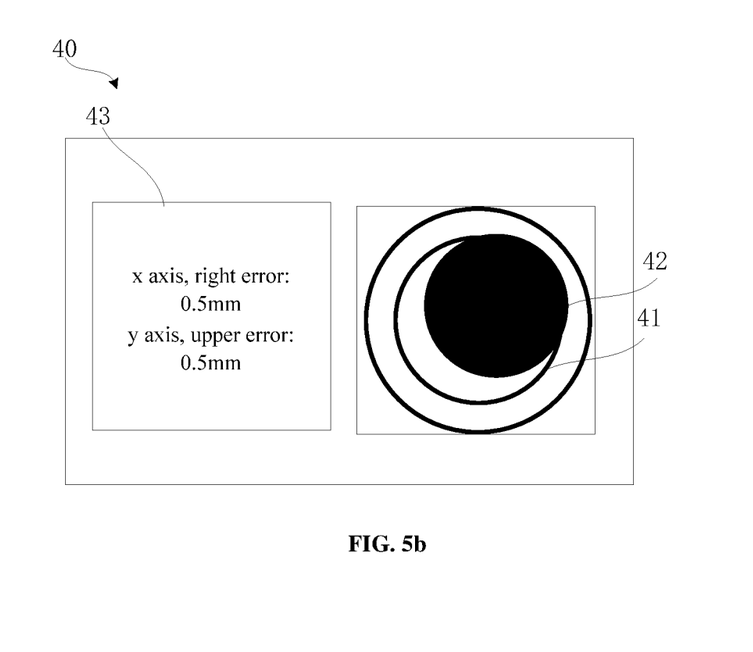

Further, in an embodiment of the present disclosure and referring to FIGS. 5a and 5b, the position detection and determination device further includes a display screen 40 connected to the determining module 30, and the display screen 40 is configured to display at least one of the standard position information 41, the real-time position information 42 and real-time error information 43 to improve the visibility of a calibration process.

As an example, in an embodiment of the present disclosure and further referring to FIGS. 1 to 4, 5a, and 5b, the positioning pin matching structure 12 can be configured to include a hollow sleeve 121 for covering the positioning pin of the load port of the silicon wafer pot to limit the standard position of the positioning pin. The positioning pin position detecting component 20 can be configured to be cylindrical, and the piezoelectric sensor 22 is arranged at the distal end 20b of the cylindrical movable body for detecting the real-time position information of the positioning pin; a slide groove (not shown) is formed in an inner wall of the hollow sleeve 121; the positioning guide rail 23 is arranged on a side wall of the cylindrical movable body 21; the shape and size of the positioning guide rail 23 can match the shape and size of the slide groove, so that the cylindrical movable body 21 can move along a position and direction limited by the slide groove, and drive the piezoelectric sensor 22 to contact the positioning pin to detect the real-time position information of the positioning pin; the standard position information 41 limited by the hollow sleeve 121 and the real-time position information 42 detected by the piezoelectric sensor 22 can be obtained and displayed on the display screen 40 in real time. For example, a real-time position image detected by the piezoelectric sensor 22 and a standard position image limited by the hollow sleeve 121 can be displayed on the display screen 40. The determining module 30 can compare the real-time position image and the standard position image to obtain an error due to the deviation of the real-time position image from the standard position image. The real-time position image, the standard position image and the error can be displayed on the display screen 40. In the embodiments of the present disclosure, the determining module 30 may be configured to obtain the real-time error information 43 of the positioning pin position by obtaining a distance between a center point of the real-time position image and a center point of the standard position image.

In an embodiment of the present disclosure, provided is a position calibration device, including:

the position detection and determination device according to any of the embodiments of the present disclosure; and a calibrating component configured to move and change the position of the positioning pin of the load port of the silicon wafer pod according to the obtained standard position information and real-time position information so that a difference between the standard position information and the real-time position information is less than or equal to a preset accuracy threshold.

Figure 6A:
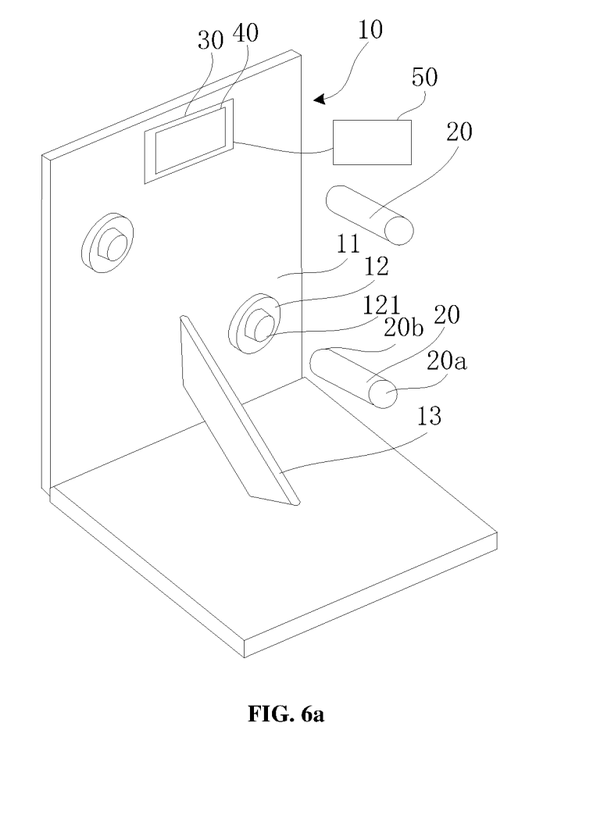
FIG. 6a is a schematic structural diagram of a position calibration device according to an embodiment of the present disclosure.

As an example, referring to FIG. 6a, in an embodiment of the present disclosure, the position calibration device includes a standard positioning pin position limiting component 10, a positioning pin position detecting component 20, and a calibrating component 50. The standard positioning pin position limiting component 10 is configured to limit standard position information of a positioning pin of a load port of a silicon wafer pod; the positioning pin position detecting component 20 is configured to detect real-time position information of the positioning pin of the load port of the silicon wafer pod; and the calibrating component 50 is configured to move and change the position of the positioning pin of the load port of the silicon wafer pod according to the obtained standard position information and real-time position information, so that a difference between the standard position information and the real-time position information is less than or equal to a preset accuracy threshold.

Figure 6B:
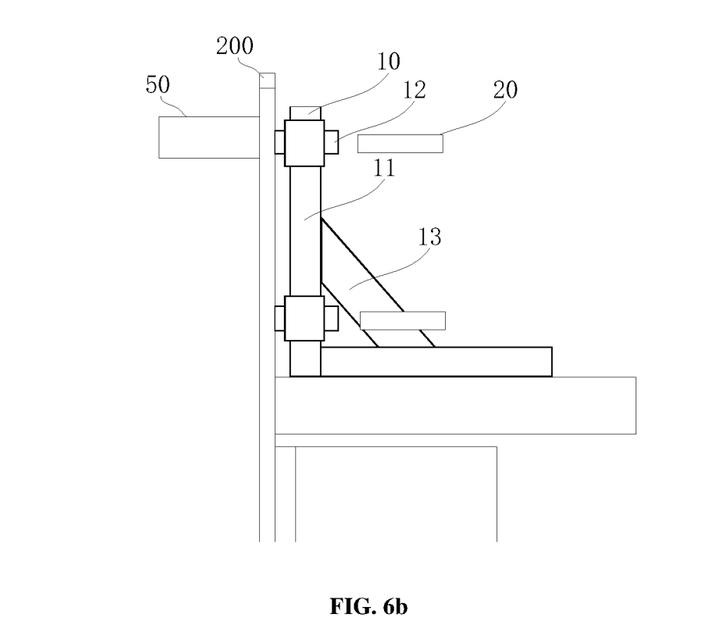
FIG. 6b is a schematic structural diagram of a position calibration device according to another embodiment of the present disclosure.

As an example, referring to FIG. 6b, in an embodiment of the present disclosure, the standard positioning pin position limiting component 10 is configured to limit the standard position information of the positioning pin of the load port of the silicon wafer pod, the positioning pin position detecting component 20 is configured to detect the real-time position information of the positioning pin, and the standard position information of the positioning pin, limited by the standard positioning pin position limiting component 10, is used as a reference standard information for the real-time position information of the positioning pin; in this way, the calibrating component 50 can move and change the position of the positioning pin according to a comparison result of the standard position information and the real-time position information, so that the difference between the standard position information and the real-time position information is gradually reduced. When the difference between the standard position information and the real-time position information is less than or equal to the preset accuracy threshold, the calibrating component 50 stops calibrating the position of the positioning pin of the load port of the silicon wafer pod. The position of the positioning pin of the load port of the silicon wafer pod is continuously moved towards the standard position until the difference between the real-time position of the positioning pin of the load port of the silicon wafer pod and a preset standard position falls in a preset accuracy range, thus realizing the position calibration for the positioning pin of the load port of the silicon wafer pod and avoiding equipment interference or abnormal operation caused by the inaccurate position of the silicon wafer pod. In this way, the production efficiency of the automated semiconductor manufacturing production line can be effectively improved, equipment downtime can be reduced, and unnecessary economic losses can be avoided.

In an embodiment of the present disclosure, a calibration accuracy of the position calibration device can be set to comply with the SEMI-57/62 standard and is used to detect and adjust different models of positioning pins of load ports of silicon wafer pods.

Figure 7:
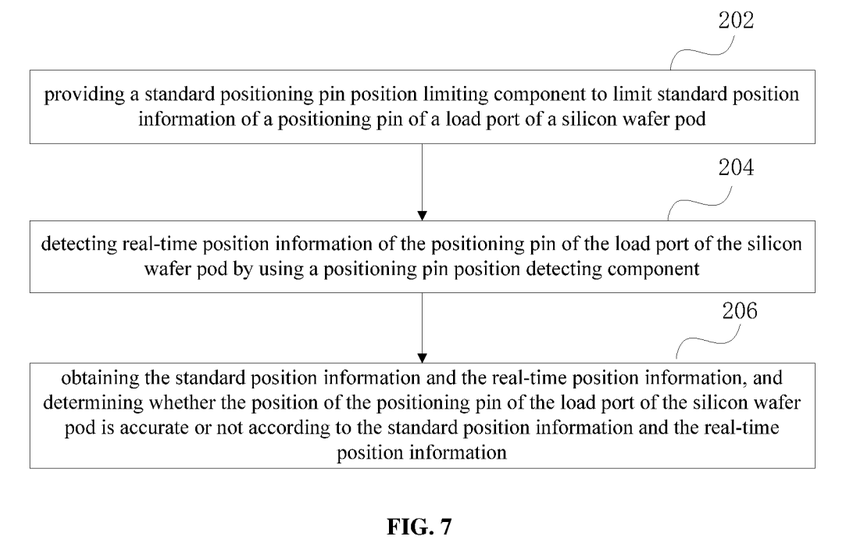
FIG. 7 is a schematic flowchart of a position detection and determination method according to an embodiment of the present disclosure.

In an embodiment of the present disclosure, provided is a position detection and determination device, referring to FIG. 7, including the following steps:

S202: providing a standard positioning pin position limiting component to limit standard position information of a positioning pin of a load port of a silicon wafer pod;

S204: detecting real-time position information of the positioning pin of the load port of the silicon wafer pod by using a positioning pin position detecting component; and S206: obtaining the standard position information and the real-time position information, and determining whether the position of the positioning pin of the load port of the silicon wafer pod is accurate or not according to the standard position information and the real-time position information.

Specifically, in the position detection and determination method in the above embodiment, the standard position information of the positioning pin of the load port of the silicon wafer pod, limited by the standard positioning pin position limiting component, is used as a reference standard information for the real-time position information of the positioning pin, so that a determining module can determine whether the position of the positioning pin of the load port of the silicon wafer pod is accurate or not according to the standard position information and the real-time position information, thereby facilitating a position adjustment for the positioning pin of the load port of the silicon wafer pod, and avoiding equipment interference or abnormal operation caused by an inaccurate position of the silicon wafer pod.

Figure 8:
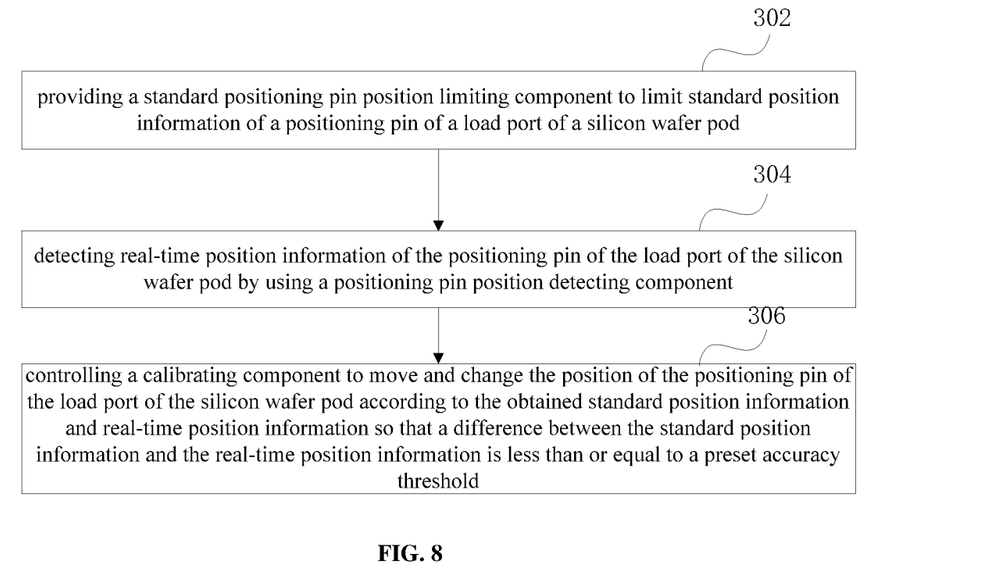
FIG. 8 is a schematic flowchart of a position calibration method according to an embodiment of the present disclosure.

In an embodiment of the present disclosure, provided is a position determination and calibration method, referring to FIG. 8, including the following steps:

S302: providing a standard positioning pin position limiting component to limit standard position information of a positioning pin of a load port of a silicon wafer pod;

S304: detecting real-time position information of the positioning pin of the load port of the silicon wafer pod by using a positioning pin position detecting component; and S306: controlling a calibrating component to move and change the position of the positioning pin of the load port of the silicon wafer pod according to the obtained standard position information and real-time position information, so that a difference between the standard position information and the real-time position information is less than or equal to a preset accuracy threshold.

Specifically, in the position determination and calibration method in the above embodiment, the position of the positioning pin of the load port of the silicon wafer pod is continuously moved towards the standard position until the difference between the real-time position of the positioning pin of the load port of the silicon wafer pod and a preset standard position falls in a preset accuracy range, thus realizing the position calibration for the positioning pin of the load port of the silicon wafer pod and avoiding equipment interference or abnormal operation caused by the inaccurate position of the silicon wafer pod. In this way, the production efficiency of the automated semiconductor manufacturing production line can be effectively improved, equipment downtime can be reduced, and unnecessary economic losses can be avoided.

In some embodiments, before performing calibration, the position determination and calibration method further includes: determining whether the position of the positioning pin of the load port of the silicon wafer pod is accurate or not according to the standard position information and the real-time position information. When the position of the positioning pin is not accurate, the calibrating component is controlled to move and change the position of the positioning pin of the load port of the silicon wafer pod so that the difference between the standard position information and the real-time position information is less than or equal to a preset accuracy threshold.

Figure 9:
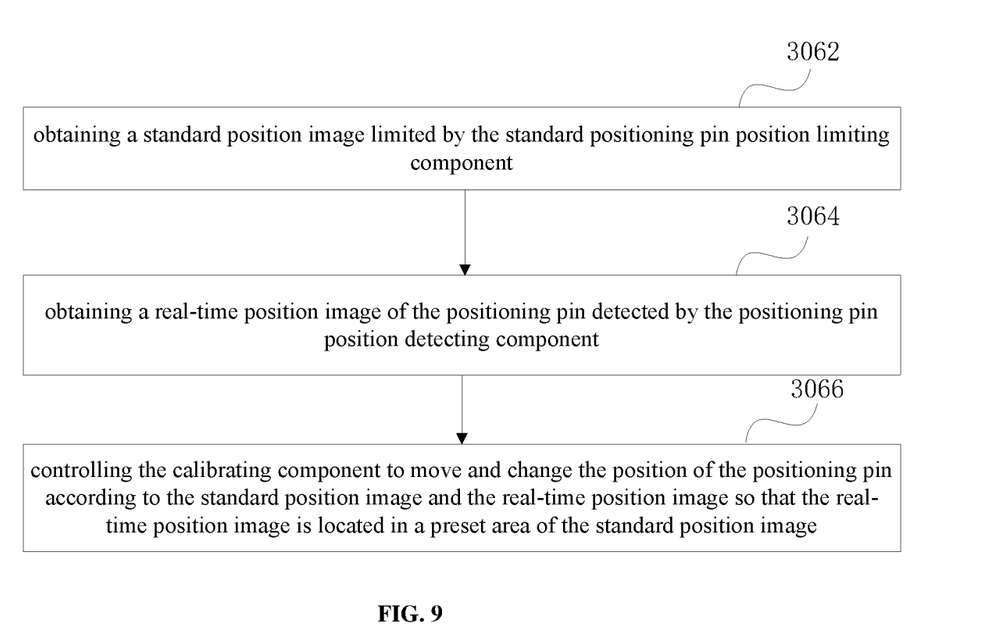
FIG. 9 is a schematic flowchart of a position calibration method according to an embodiment of the present disclosure.

Further, in an embodiment of the present disclosure, provided is a position calibration method. Referring to FIG. 9, the position calibration method differs from the embodiment shown in FIG. 8 in that step S306 includes:

S3062: obtaining a standard position image limited by the standard positioning pin position limiting component;

S3064: obtaining a real-time position image of the positioning pin detected by the positioning pin position detecting component; and S3066: controlling the calibrating component to move and change the position of the positioning pin according to the standard position image and the real-time position image so that the real-time position image is located in a preset area of the standard position image.

Specifically, in the position calibration method in the above embodiment, the calibrating component is controlled to move and change the position of the positioning pin so that the real-time position image is located in the preset area of the standard position image, thereby facilitating position calibration for the positioning pin and also improving the accuracy of the calibration.

Figure 10:
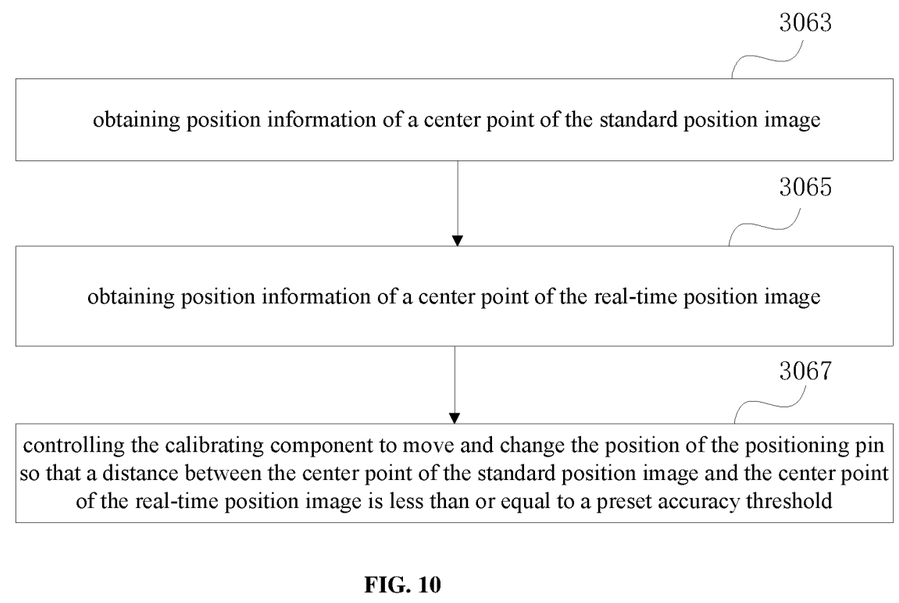
FIG. 10 is a schematic flowchart of a position calibration method according to an embodiment of the present disclosure.

Further, in an embodiment of the present disclosure, provided is a position calibration method. Referring to FIG. 10, the position calibration method differs from the embodiment shown in FIG. 9 in that step S306 further includes:

S3063: obtaining position information of a center point of the standard position image;

S3065: obtaining position information of a center point of the real-time position image; and S3067: controlling the calibrating component to move and change the position of the positioning pin so that a distance between the center point of the standard position image and the center point of the real-time position image is less than or equal to a preset accuracy threshold.

Specifically, in the position calibration method in the above embodiment, the calibrating component is controlled to move in a direction that makes the distance between the two center points smaller until the distance between the center point of the standard position image and the center point of the real-time position image is less than or equal to the preset accuracy threshold, thereby effectively improving the accuracy and efficiency of the calibration.

In an embodiment of the present disclosure, provided is a position calibration system, including a memory, a processor, and a computer program stored in the memory and capable of running on the processor. The processor implements the steps of any of the methods described in the embodiments of the present disclosure when the computer program is executed.

In an embodiment of the present disclosure, provided is a computer-readable memory medium, having a computer program stored thereon, and the computer program implements the steps of any of the methods described in the embodiments of the present disclosure when executed by a processor.

It should be understood that although the various steps in the flowcharts in FIGS. 7 to 10 are displayed in sequence as indicated by arrows, these steps are not necessarily performed sequentially in the order indicated by the arrows. Unless described clearly herein, there is no strict limitation on the execution order of these steps, and these steps can be executed in other orders. Moreover, at least part of the steps in FIGS. 7 to 10 may include multiple sub-steps or multiple stages. These sub-steps or stages are not necessarily executed at the same time, but can be executed at different time. These sub-steps or stages are not necessarily executed in sequence, but may be executed in turn or alternately with other steps or at least a part of the sub-steps or stages of other steps.

For the specific limitation on the position detection and determination method or the position calibration method, reference can be made to the above limitation on the position detection and determination device or the position calibration device, and it will not be repeated here.

Various modules in the above position detection and determination device or the position calibration device can be implemented in whole or in part by software, hardware, and a combination thereof. The above modules can be embedded in or independent of the processor in the position calibration system in the form of hardware, or can be stored in the memory of the position calibration system in the form of software, so that the processor can call and execute corresponding operations of the above modules.

Figure 11:
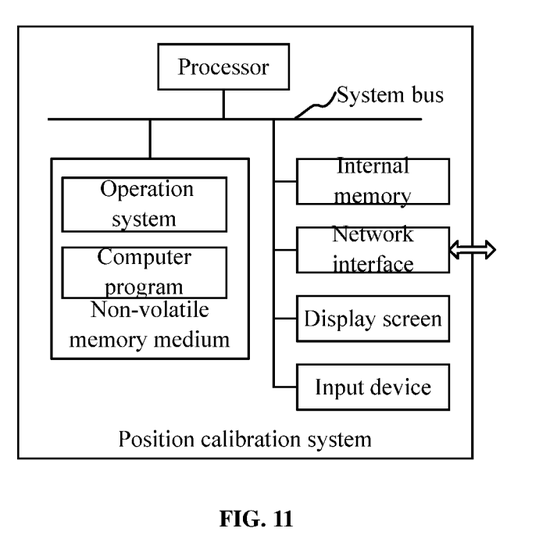
FIG. 11 is a schematic architecture diagram of a position calibration system according to an embodiment of the present disclosure.

In an embodiment of the present disclosure, a position calibration system is provided. The position calibration system may be a terminal, and its internal structure diagram may be as shown in FIG. 11. The position calibration system includes a processor, a memory, a network interface, a display screen and an input device connected through a system bus. The processor of the position calibration system is configured to provide calculation and control capabilities. The memory of the position calibration system includes a non-volatile memory medium and an internal memory. The non-volatile memory medium stores an operating system and a computer program thereon. The internal memory provides an environment for the operation of the operating system and the computer program in the non-volatile memory medium. The network interface of the position calibration system is configured to communicate with an external terminal through a network connection. The computer program is executed by the processor to implement a position detection and determination method or a position calibration method. The display screen of the position calibration system may be a liquid crystal display or an electronic ink display. The input device of the position calibration system can be a touch layer covering the display screen, or may be a button, trackball or touchpad arranged on a housing of the position calibration system, or also may be an external keyboard, touchpad, or mouse.

Those skilled in the art can understand that the structure shown in FIG. 11 is only a block diagram of a part of the structure related to the solution of the present disclosure, and does not constitute a limitation on the position calibration system to which the solution of the present disclosure is applied. Specifically, the position calibration system may include more or fewer components than shown in the figure, or combine certain components, or have a different component arrangement.

In an embodiment of the present disclosure, provided is a position calibration system, including a memory, a processor, and a computer program stored in the memory and capable of running on the processor. The processor implements the following steps when the computer program is executed:
    providing a standard positioning pin position limiting component to limit standard position information of a positioning pin of a load port of a silicon wafer pod;
    detecting real-time position information of the positioning pin of the load port of the silicon wafer pod by using a positioning pin position detecting component; and
    obtaining the standard position information and the real-time position information, and determining whether the position of the positioning pin of the load port of the silicon wafer pod is accurate or not according to the standard position information and the real-time position information.

In an embodiment of the present disclosure, the processor further implements the following steps when the computer program is executed:
    providing a standard positioning pin position limiting component to limit standard position information of a positioning pin of a load port of a silicon wafer pod;
    detecting real-time position information of the positioning pin of the load port of the silicon wafer pod by using a positioning pin position detecting component; and
    controlling a calibrating component to move and change the position of the positioning pin of the load port of the silicon wafer pod according to the obtained standard position information and real-time position information, so that a difference between the standard position information and the real-time position information is less than or equal to a preset accuracy threshold.

In an embodiment of the present disclosure, the processor further implements the following steps when the computer program is executed:
    providing a standard positioning pin position limiting component to limit standard position information of a positioning pin of a load port of a silicon wafer pod;
    detecting real-time position information of the positioning pin of the load port of the silicon wafer pod by using a positioning pin position detecting component;
    obtaining a standard position image limited by the standard positioning pin position limiting component;

obtaining a real-time position image of the positioning pin detected by the positioning pin position detecting component; and controlling the calibrating component to move and change the position of the positioning pin according to the standard position image and the real-time position image, so that the real-time position image is located in the middle of the standard position image.

In an embodiment of the present disclosure, the processor further implements the following steps when the computer program is executed:

providing a standard positioning pin position limiting component to limit standard position information of a positioning pin of a load port of a silicon wafer pod;

detecting real-time position information of the positioning pin of the load port of the silicon wafer pod by using a positioning pin position detecting component;

obtaining a standard position image limited by the standard positioning pin position limiting component;

obtaining position information of a center point of the standard position image;

obtaining a real-time position image of the positioning pin detected by the positioning pin position detecting component;

obtaining position information of a center point of the real-time position image; and controlling a calibrating component to move and change the position of the positioning pin according to the standard position image and the real-time position image so that a distance between the center point of the standard position image and the center point of the real-time position image is less than or equal to a preset accuracy threshold.

The technical features of the above-described embodiments may be arbitrarily combined. For the sake of brevity of description, all possible combinations of the technical features in the above embodiments are not described. However, as long as there is no contradiction between the combinations of these technical features, all should be considered as the scope of the present description.

The above-described embodiments only show several implementation ways of the present disclosure, which are more specific and detailed, but not to be construed as limiting the scope of the present disclosure. It should be noted that those of ordinary skill in the art may further make variations and improvements without departing from the conception of the present disclosure, and these all fall within the protection scope of the present disclosure. Therefore, the patent protection scope of the present disclosure should be subject to the appended claims.

What is claimed is:

1. A position detection and determination device, comprising:
   a standard positioning pin position limiting device configured to limit standard position information of a positioning pin of a load port of a silicon wafer pod;
   a positioning pin position detecting element configured to detect real-time position information of the positioning pin of the load port of the silicon wafer pod; and
   a determining circuit configured to obtain the standard position information and the real-time position information, and determine whether the position of the positioning pin of the load port of the silicon wafer pod is accurate or not according to the standard position information and the real-time position information;
   wherein the standard positioning pin position limiting device comprises:
   a bearing carrier; and
   positioning pin matching structures arranged on the bearing carrier and configured to limit standard positions of the positioning pins.

2. The position detection and determination device according to claim 1, wherein the positioning pin position detecting element comprises:
   a cylindrical movable body, and
   a piezoelectric sensor arranged at a distal end of the movable body for detecting the real-time position information of the positioning pin; wherein
   the movable body is configured to move in a preset direction to drive the piezoelectric sensor to come into contact with the positioning pin so that the piezoelectric sensor detects the real-time position information of the positioning pin.

3. The position detection and determination device according to claim 2, wherein
   the positioning pin position detecting element further comprises:
   a positioning guide rail configured to limit a moving position and a moving direction of the movable body; wherein
   the movable body is configured to move along the positioning guide rail to drive the piezoelectric sensor to contact and cover an upper surface of the positioning pin so that the piezoelectric sensor detects image information of the upper surface of the positioning pin.

4. The position detection and determination device according to claim 1, further comprising:
   a display screen connected to the determining circuit and configured to display at least one of the standard position information, the real-time position information and real-time error information.

5. A position calibration device, comprising:
   the position detection and determination device according to claim 1; and
   a calibrating component configured to move and change the position of the positioning pin of the load port of the silicon wafer pod according to the obtained standard position information and real-time position information so that a difference between the standard position information and the real-time position information is less than or equal to a preset accuracy threshold.

6. A position determination and calibration method, comprising:
   providing a standard positioning pin position limiting device to limit standard position information of a positioning pin of a load port of a silicon wafer pod;
   detecting real-time position information of the positioning pin of the load port of the silicon wafer pod by using a positioning pin position detecting component; and
   determining whether the position of the positioning pin of the load port of the silicon wafer pod is accurate or not according to the standard position information and the real-time position information;
   and if not, controlling a calibrating element to move and change the position of the positioning pin of the load port of the silicon wafer pod so that a difference between the standard position information and the real-time position information is less than or equal to a preset accuracy threshold.

7. The position determination and calibration method according to claim 6, wherein
   the controlling a calibrating element to move and change the position of the positioning pin of the load port of the silicon wafer pod according to the obtained standard position information and real-time position information comprises:

obtaining a standard position image limited by the standard positioning pin position limiting device;

obtaining a real-time position image of the positioning pin detected by the positioning pin position detecting component; and controlling the calibrating component to move and change the position of the positioning pin according to the standard position image and the real-time position image so that the real-time position image is located in a preset area of the standard position image.

8. The position determination and calibration method according to claim 7, wherein the controlling a calibrating component to move and change the position of the positioning pin of the load port of the silicon wafer pod according to the obtained standard position information and real-time position information further comprises:

obtaining position information of a center point of the standard position image;

obtaining position information of a center point of the real-time position image; and controlling the calibrating component to move and change the position of the positioning pin so that a distance between the center point of the standard position image and the center point of the real-time position image is less than or equal to a preset accuracy threshold.

* * * * *